United States Patent [19]
Le Corre et al.

[11] Patent Number: 5,213,906

[45] Date of Patent: May 25, 1993

[54] COMPOSITE MATERIAL COMPRISING A LAYER OF A III-V COMPOUND AND A LAYER OF RARE EARTH PNICTIDE, PRODUCTION PROCESS AND APPLICATION

[75] Inventors: Alain Le Corre, Pleumeur Bodou; André Guivarc'H, Lannion; Jacques Caulet, Begard, all of France

[73] Assignee: Etat Francais, France

[21] Appl. No.: 505,558

[22] Filed: Apr. 6, 1990

[30] Foreign Application Priority Data

Apr. 13, 1989 [FR] France ............................ 8904899

[51] Int. Cl.$^5$ ............................................... B32B 9/00
[52] U.S. Cl. ...................................... 428/688; 428/689; 428/697; 428/699; 428/700; 428/704; 437/176; 501/152; 257/12; 257/44
[58] Field of Search ............. 428/688, 689, 697, 700, 428/699, 704; 156/DIG. 63, 83, 614, 610, 613, DIG. 70, DIG. 81; 501/152; 148/33.3; 437/176; 357/15, 16

[56] References Cited

U.S. PATENT DOCUMENTS

| | | | |
|---|---|---|---|
| 3,632,431 | 1/1972 | Andre | 437/96 |
| 4,574,056 | 3/1986 | Kimura | 428/688 |
| 4,575,577 | 3/1986 | Fraas | 437/2 |
| 4,751,201 | 6/1988 | Nottenburg | 428/688 |
| 4,793,872 | 12/1988 | Meunier | 437/51 |
| 4,861,417 | 8/1989 | Mochizuki | 156/DIG. 81 |

OTHER PUBLICATIONS

Applied Physics Letters; vol. 53; No. 26; Dec. 26, 1988; pp. 2608–2610.

Applied Physics Letters; vol. 53; No. 2; Jul. 11, 1988; pp. 99–101.

*Primary Examiner*—Ellis P. Robinson
*Assistant Examiner*—Nasser Ahmad
*Attorney, Agent, or Firm*—Blakely, Sokoloff, Taylor & Zafman

[57] ABSTRACT

The present invention relates to a composite material. This material comprises at least one layer A of III-V compound and one epitaxial layer B on said layer of III-V compounds, the epitaxial layer corresponding to the empirical formula REPc, where RE is chosen from the group comprising the rare earths (scandium, yttrium, preferably lanthanum, lanthanides, and their mixtures); and where Pc is chosen from the elements of column V of the periodic table of the elements and their mixtures, and, when Pc contains arsenic, the compound REPc is at least a ternary compound.

Application is to the electronics industry.

12 Claims, 4 Drawing Sheets

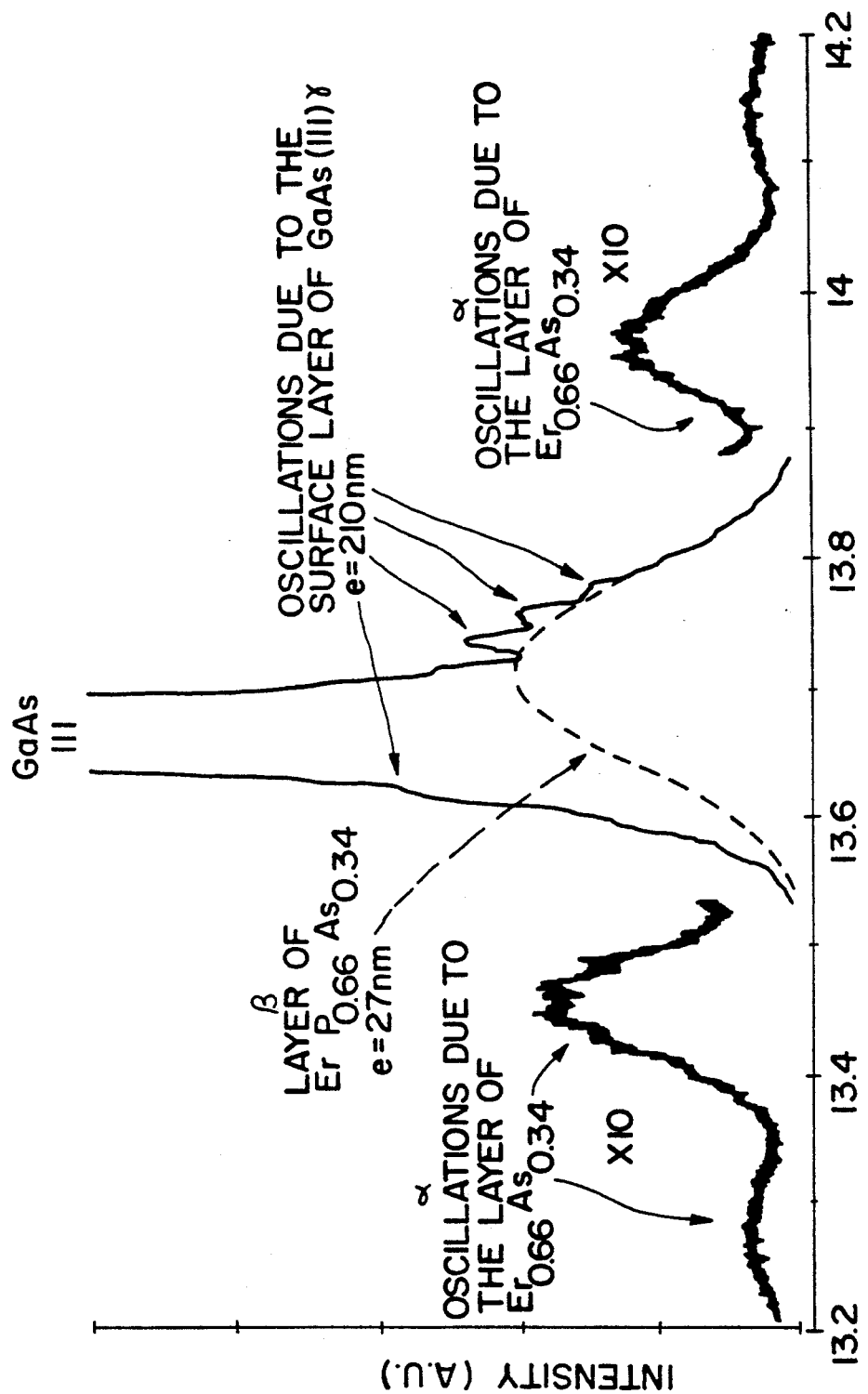

COMPOSITE MATERIAL COMPRISING A LAYER OF A III-V COMPOUND AND A LAYER OF RARE EARTH PNICTIDE, PRODUCTION PROCESS AND APPLICATION

BACKGROUND OF THE INVENTION

1. Field of the Invention

The present invention relates to a new composite material comprising a substrate, at least one layer of a III-V compound and at least one layer having a metallic character. It also relates to electronic components containing this material and to a process for the production of said material.

2. Description of the Related Art

The prospects offered by components based on structures having a buried metallic layer and the physical studies on the metal/semiconductor (M/SC) multi-layer composites are the origin of the numerous studies carried out with a view to epitaxial deposition or growth of metal films on semiconductor substrates.

The work on the epitaxy of silicides on silicon, in particular by FURUKAWA, S. and by ISHIWARA, H., Jpn. J. Appl. Phys. 22, Suppl. 22-1 (1983) 21-27 and by SAITOH, S., ISHIWARA, H., ASANO, T., FURUKAWA, S., Jpn. J. Appl. Phys. 20 (1981) 1649-1656 has already led to the production of transistors based on buried metal (cf. ROSENCHER, E., DELAGE, S., CAMPIDELLI, Y., ARNAUD D'AVITAYA, F., Electron. Lett. 20 (1985) 762-764 and ARNAUD D'AVITAYA, F. DELAGE, SQ., ROSENCHER, E., DERRIEN, J., J. Vac. Sci. Technol. B 3 (1985) 770-773).

Despite the great potential value of such components and despite numerous studies, the situation is far less advanced in the case of the III-V compounds because the metal or the metal compound to be deposited or grown epitaxially must be stable to heat, in particular up to a temperature of 500°-600° C. to enable reepitaxy of the semiconductor.

The deposition of layers of metals such as aluminum, silver and iron has been proposed, in particular with gallium arsenide as substrate. However, on the one hand, the results are mediocre and, on the other hand, the structures formed have too low a thermal stability and too poor a mesh agreement to enable reepitaxy of the III-V compound making up the starting support on the metallic layer.

It is preferable that the interface between the metallic layer and the semiconductor layer should be abrupt, that is to say that there is a true continuous solution between the layers. However, it is permissible that the transition zone extends over at most ten monoatomic layers, advantageously at most five, and preferably at most two. The ideal is the perfect continuous or discontinuous solution.

Other tests have been carried out; for example the deposition of metals which are deliberately interacted with the substrate with the aim of obtaining, by interdiffusion in solid phase, compounds of the type $M_x(GaAs)_y$, which are equivalent to silicides, on Si, or such as a co-deposition of silicon and a metal to obtain a silicide.

No success has been achieved hitherto in obtaining layers having a metallic character which are satisfactory. More recently, it has been proposed to grow epitaxial layers consisting of a compound of arsenic and ytterbium (cf. Article "Analysis of ytterbium arsenide films grown on GaAs by molecular beam epitaxy" by H. G. RICHETER, R. S. SMITH, N. HERRES, M. SEELMANN-EGGEBERT and P. WENNEKERS, Appl. Phys. Lett. 53 (2), 11 July 1988, pages 99-101). Although the results were better than those previously found, the authors have indicated that an imperfection in the epitaxial growth was evident in this case.

Moreover, the epitaxy of GaAs on a layer of rare earth(s) arsenide does not enable a homogeneous layer to be obtained.

SUMMARY OF THE INVENTION

It is for this reason that one of the aims of the present invention is to provide a composite material consisting, on the one hand, of a III-V compound and, on the other hand, of a compound having metallic character, which material is resistant to epitaxy temperatures even when these temperatures are of the order of 500° to 600° C. or even above.

Another aim of the present invention is to provide a composite of the above type in which the mesh agreement between its constituent materials is excellent, that is to say the discrepancy does not exceed 1%, advantageously 0.5%, and preferably 0.1%.

Another aim of the present invention is to provide a material of the above type which permits subsequent epitaxy of a III-V compound of the same mesh (with a tolerance similar to that indicated above) on the layer having a metallic character.

These aims and others which will become apparent below are achieved by means of the composite material which comprises at least one layer (A) forming the substrate of III-V compound and one epitaxial layer (B) on said layer of III-V compound, said epitaxial layer corresponding to the empirical formula REPc, where RE is chosen from the group comprising the rare earths (scandium, preferably yttrium, lanthanum, lanthanides, and their mixtures); and where Pc is chosen from the elements of column V of the periodic table of the elements and their mixtures, and, when Pc is or contains arsenic, the compound REPc is at least a ternary compound.

BRIEF DESCRIPTION OF THE DRAWINGS

FIG. 4 shows the x-ray diagram obtained with the stack of Example 3 in which the oscillations observed indicate that the layer of ternary compound produced by epitaxy and the layer of gallium arsenide produced by re-epitaxy are of good crystal quality.

DESCRIPTION OF THE PREFERRED EMBODIMENTS

Figure 1:
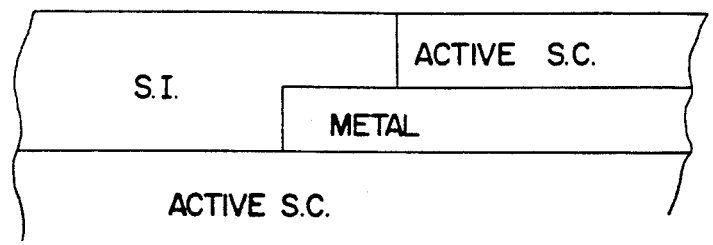
FIG. 1 is a drawing of the epitaxial layers in accordance with the present invention.

A III-V compound is to be understood to mean the compounds having a structure of the zinc blende type in which the III compounds are chosen from the group comprising aluminum, gallium, indium and their mixtures. The mixtures can thus be ternary mixtures.

The V compounds are chosen from the group of elements comprising phosphorus, arsenic, antimony and their binary mixtures.

It should be noted that the metalloid compounds of column V with the metals are increasingly being designated by the term pnictides.

The present invention is based on the surprising finding that the pnictides, in particular the ternary or quaternary mixtures according to the present invention, have a conductivity which can be regarded as metallic and this despite a prior art (cf. the article by F. HULLIGER, entitled "Rare Earth Pnictides" in the Handbook on the Physics and Chemistry of Rare Earths, edited by K. A. Gschnelder Jr. and Jr. and L. Eyring, North Holland Publishing Company 1979) which indicated that the phosphides, arsenides and antimonides of rare earths were generally regarded as semiconductors or having very high resistivities incompatible with a use in microelectronics as a metallic layer.

More recently, two articles have described the production of layers of ytterbium arsenide and erbium arsenide having metallic electrical properties ("Analysis of ytterbium arsenide films grown on GaAs by molecular beam epitaxy" already cited and "Epitaxial growth of ErAs on (100)GaAs" by C. J. PALMSTRÖM, N. TABATABAIE and S. J. ALLEN, Jr. Bellcore, Appl. Phys. Lett. 53(26), 26 December 1988, pages 2608-2610).

These two articles did not enable it to be determined whether the resistivities found were particular cases linked to specific characteristics of ytterbium or erbium, or whether these new properties were linked to the composition or to the structure of the epitaxial layer.

Furthermore, for numerous applications of the present invention it was necessary for the ternary or quaternary compounds to have the properties of metallic layers.

Furthermore, both the study which led to the present invention and the studies which led to the abovementioned publications have shown that the pure rare earth arsenides were extremely reactive in air and lost their properties very rapidly. In the case of ytterbium and erbium arsenides, the problem is complicated by the fact that it is difficult to restore a protective epitaxy of gallium arsenide on these layers of ytterbium or erbium arsenides.

Surprisingly, it has been possible to demonstrate that the pnictides, and in particular the ternary or quaternary compounds according to the present invention, had much better resistance and were much more stable than the ytterbium or erbium arsenides, this being the case in particular when phosphorus is used as the element of column V of the periodic table of the elements.

The ratios of the constituents in the ternary or quaternary compounds are adjusted such that the mesh agreement will be as perfect as possible. The agreement is advantageously effected such that the variation in the mesh parameters ($\Delta a/a$) is less than 2% or even than 1%, and preferably 0.5 to 1%. Discrepancies of less than 0.1% are sufficient to be sure that all problems will be avoided.

According to the present invention, all the tests with the appropriate ternary compounds have enabled a mesh discrepancy of at most a few (three or four) $10^{-4}$ to be found. In some cases it was not possible to detect any discrepancy.

The epitaxial layers in general have a resistivity of between 50 and 200 micro-ohms/cm, which corresponds to a "metallic conductivity" value.

Preferred elements from the elements of column V of the periodic table of the elements are arsenic, antimony and especially phosphorus. This latter element is of particular value because, on its own or in a composition, it allows a better resistance of the epitaxial layer to external elements ($O_2$, ...), this being in contrast to rare earth arsenide phases which are extremely reactive and completely oxidized after a few weeks in air.

Thus, preferred mixtures of V compound which may be mentioned are those made by phosphorus with arsenic or with antimony.

Contrary to what could have been feared, no zone of immiscibility between the various rare earth pnictides was found in the course of the numerous tests which led to the present invention. However., the immiscibility of pnictides is well known, in particular for gallium arsenide and gallium antimonide.

The contact between the substrate and the epitaxial layer is different depending on whether or not the group V element contained in the epitaxial layer is at least in part that of the substrate.

In the first case, the contact is better and the networks completely overlap one another. In the second case, an extremely fine and intermediate layer appears to form. The production of mesh agreement is preferably obtained using ternary compounds, either with a single element of column V or with a single element of the rare earth group.

For reasons of ease of synthesis which will be called to mind below, the most studied solution was the use of a single rare earth with two elements from column V.

By way of illustration, the tables below show the various compositions of the epitaxial layers of erbium pnictides as a function of the substrates.

TABLE 1

| Substrate | Compounds containing the same V element as the substrate | Compounds not containing the same V element as the substrate |
|---|---|---|
| GlAs | $ErP_{0.63}As_{0.37}$ | $ErP_{0.90}Sb_{0.10}$ |
| APAs | $ErP_{0.57}As_{0.43}$ | $ErP_{0.89}As_{0.11}$ |
| InP | $ErP_{0.48}As_{0.52}$ | $ErAs_{0.66}Sb_{0.34}$ |
| InAs | $ErAs_{0.13}Sb_{0.87}$ | $ErP_{0.10}Sb_{0.90}$ |
| GaSb | $ErP_{0.02}Sb_{0.98}$ | — |
|  | $ErAs_{0.03}Sb_{0.97}$ |  |

It should be noted that the tolerance either side of the indicated values is 0.05, and preferably 0.02.

TABLE II

| Semiconductors | Phosphorus compounds (a in Å) | | $\frac{\Delta a}{a}$ (%) | Arsenic compounds (a in Å) | | $\frac{\Delta a}{a}$ (%) | Antimony compounds (a in Å) | | $\frac{\Delta a}{a}$ (%) |
|---|---|---|---|---|---|---|---|---|---|
| AIP 5.4510Å | ScP | 5.3128 | −25 | | | | | | |
|  | LuP | 5.533 | +15 | ScAs | 5.487 | +6.6 | | | |
| GaP 5.4512Å | ScP | 5.3128 | −25 | | | | | | |
|  | LuP | 5.533 | +15 | ScAs | 5.487 | +6.6 | | | |
| GaAs | DyP | 5.653 | −0.05 | | | | | | |

TABLE II-continued

| Semi-conductors | Phosphorus compounds (a in Å) | | $\frac{\Delta a}{a}$ (%) | Arsenic compounds (a in Å) | | $\frac{\Delta a}{a}$ (%) | Antimony compounds (a in Å) | | $\frac{\Delta a}{a}$ (%) |
| --- | --- | --- | --- | --- | --- | --- | --- | --- | --- |
| 5.6533Å | YP | 5.662 | +1.5 | LuAs | 5.680 | +4.7 | ScSb | 5.838 | +32 |
| AlAs |  |  |  |  |  |  |  |  |  |
| 5.6605Å | DyP | 5.653 | −1.3 |  |  |  |  |  |  |
| InP | YP | 5.662 | +0.26 | LuAs | 5.680 | +3.4 | ScSb | 5.838 | +31 |
| 5.8686Å | NdP | 5.838 | −5.2 | GdAs | 5.862 | −1.1 | ScSb | 5.838 | −5.2 |
| InAs | PrP | 5.908 | +6.7 | SmAs | 5.921 | +8.9 |  |  |  |
| 6.05864Å | LaP | 6.025 | −5.5 | PrAs | 6.009 | −8.1 | LuSb | 6.055 | −5.6 |
| GaSb |  |  |  | CeAs | 6.072 | +2.24 | YbSb | 6.082 | +3.9 |
| 6.0959Å | LaP | 6.025 | −11 | CeAs | 6.072 | −3.9 | TmSb | 6.091 | −0.8 |
| AlSb |  |  |  | LeAs | 6.137 | +6.7 | ErSb | 6.107 | +1.8 |
| 6.1355Å |  |  |  |  |  |  | YSb | 6.1355 | 0 |
| InSb |  |  |  | LaAs | 6.137 | +0.24 |  |  |  |
| 6.4794Å |  |  |  |  |  |  | CeSb | 6.412 | −10 |
|  |  |  |  |  |  |  | LeSb | 6.49 | +1.6 |

Table II shows, for the main III–V compounds, how they can be boxed as regards size by rare earth pnictides. The good agreements between the various elements can be determined empirically by experimentation around values calculated by the rule of three from $\Delta a/a$. Some compounds are virtually epitaxiable with a good mesh agreement, that is to say $$\frac{\Delta a}{a} < 1\%,$$

on the substrates without it being necessary to have recourse to ternary mixtures. These are:
on gallium arsenide, dysprosium phosphide;
on aluminum antimonide, yttrium antimonide;
on gallium antimonide, thulium antimonide.

Table III below indicates possible ternary compounds for the main III-V semiconductors. However, it is appropriate to indicate that the rare earths capable of being brought to valency IV can sometimes have drawbacks, and when this is possible, it is sometimes desirable to replace them by rare earth elements which do not have the valency IV and have similar atomic radii.

TABLE III

| Substrate | Agreeing ternary compound containing the same V element as the substrate |
| --- | --- |
| AlP | $Sc_{0.61} Y_{0.39}$ P |
| GaP | $Sc_{0.61} Y_{0.39}$ P |
| GaAs | $Sc_{0.48} Y_{0.52}$ As |
| AlAs | $Sc_{0.46} Y_{0.54}$ As |
| InP | $Nd_{0.58} Pr_{0.44}$ P |
| InAs | $Ce_{0.22} Pr_{0.78}$ As |
| GaSb | $Tm_{0.70} Er_{0.30}$ Sb |
| AlSb | Y Sb binary |
| InSb | $Ce_{0.11} La_{0.89}$ Sb |

The present invention also relates to the preparation of epitaxial layers. This aim is achieved by a process for the preparation of an epitaxial layer on a III-V semiconductor substrate by not co-deposition, for example by molecular or atomic jets (at up to about 500° C. to about 600° C.), which comprises adjusting the atomic or molecular jet of the constituent elements of the epitaxial layer so as to comply with the ratios of the column V elements amongst themselves and of the column III elements amongst themselves in said layer.

In fact, according to the above technique it has been shown that a careful adjustment of the ratio between III element(s) and V element (s) was not neccessary, the surplus elements having to be, however, the V elements, the stoichiometric excess of which is re-evaporated.

The various V components of the layers to be rendered epitaxial can be formed from flux either of hydrogen-containing compounds such as $PH_3$ or $AsH_3$ or of compounds of the alkyl-metalloid type, such as tri-($C_1$-$C_8$-alkyl)-antimony (the latter are preferred to $SbH_3$ which is particularly toxic). The alkyl-antimony compounds are largely preferable; cracking of these compounds is carried out in the customary manner.

It is also possible, in particular in the case of antimony and in the case of arsenic, to use simple effusion cells with, if necessary, a cracker which in particular allows $As_4$ molecules to change into $As_2$. The rare earths themselves can be fed by means of a furnace brought to an elevated temperature of up to the order of 1100° C. to 1400° C.; if higher temperatures are necessary, it is then expedient to use an electron gun. The temperature of the furnaces enables the flux of the metals to be adjusted.

The epitaxial layers of rare earth pnictides produced epitaxial in accordance with the present invention can have a thickness of between a monolayer and 1 micrometer in thickness.

The purity and the crystal quality must be such that the resistance of said pnictides is at most about 0.2 milliohm/cm.

All of the layers produced in accordance with the present invention allow a new layer (C) to be grown epitaxially, the semiconductor of which has the same parameter as that of the substrate, that is to say that the layer A, in particular the III-V semiconductor, can be the same as that of this latter layer. It is thus possible to produce electronic components, for example structures of field effect transistors with buried electrodes as described in "Microwaves" of February 1982, page 67. These structures can be used in microwave circuits and in permeable base transistors. They also allow the positioning of the mass plane of the active layer of the components. They also allow a threedimensional structure, such as shown in FIG. 1.

The following non-limiting examples illustrate the invention.

Experimental procedure

Epitaxy support by Riber MBE 2300 chemical and molecular jets to which an Airco-Témescal electron gun has been added allowing evaporation of refractory metals. The substrates of III-V compounds are positioned in the form of a sample; the deposits are then produced under ultra-vacuum conditions ($10^{-10}$ torr equivalent to $10^{-10}$ Pa). In the deposition chamber the samples are heated up to the desorbtion temperature of the native oxide under the flux of the V element of the III–V layer and then cooled to the temperature Ts at which the deposition has to be effected. The temperature Ts is that measured at the pyrometer (indefinite to 10° C.).

The fluxes of rare earths are obtained with the aid of effusion cells. With regard to erbium, the temperature of the furnace is 1140° C., which gives an erbium flux of the order of $10^{14}$ atoms of erbium/cm$^2$/second and leads to growth rates of 0.16 μm/hour for the compounds. Erbium is the factor limiting the growth rate.

The fluxes of V element were produced in the following way: the flux of arsenic and of phosphorus was produced from their hydrogen-containing compounds arsine and phosphine and the flux of antimony was obtained with the aid of an effusion cell equipped with a cracker. Unless indicated otherwise, the temperatures of the substrates are as follows: 500° C. for GaAs, 490° C. for InP and 500° C. for GaSb. The epitaxy was carried out to obtain thicknesses of about 100 Å (10 nanometers) to 1000 Å (100 nanometers).

EXAMPLE 1

Epitaxy of binary compounds

Initially, it was attempted to confirm the results obtained by other teams on epitaxial compounds of rare earth arsenide on layers of GaAs, working at a temperature of 580° C. In addition, tests were carried out to measure the electrical behavior and the general physical properties of erbium phosphides and erbium antimonide on GaAs and on other substrates such as indium phosphide or gallium antimonide. The deposits on InP were produced at 500° C., and the deposits on GaSb were produced at 450° C. The planes used are the 001 and 111 planes. The resistivity measurements gave the following results:

For ErAs : 60 micro-ohms/cm
For ErP : 150 micro-ohms/cm
For ErSb : 60 micro-ohms/cm The Er fluxes were supplied as described above from an effusion cell heated to 1140° C. The As$_2$ and P$_2$ fluxes were supplied with the aid of AsH$_3$ and PH$_3$ cracked in a high-temperature cell, and the antimony flux was supplied with the aid of an effusion cell fitted with a cracker.

EXAMPLE 2

Epitaxy of ternary compounds

The techniques used are those as described above. It was necessary merely to adjust the fluxes of the column V compounds so as to obtain mesh agreement. The flux limiting the growth rate is the flux of rare earths, and the erbium flux in the case under consideration.

The tests carried out within the framework of the present example showed that a virtually perfect mesh agreement (either undetectable or significantly less than $5 \times 10^{-4}$ for the various samples) was obtained by adjusting the ratio of the AsH$_3$ and PH$_3$ fluxes to a value such that PH$_3$/PH$_3$+AsH$_3$ is approximately between 0.57 and 0.6. The atomic composition of the layers thus obtained, determined by retrodiffusion of He$^+$ ions charged once, corresponds to the atomic formula Er P$_{0.65 \pm 0.05}$ As$_{0.35 \pm 0.05}$, showing that the bonding coefficients of arsenic and of phosphorus are not very substantially different.

The resistivity measured is 80 micro-ohms/cm, which is a value lower than the weighted average of the resistivity of ErAs and ErP (115 micro-ohms/cm); there is thus a synergistic effect.

Moreover, the resistance to external attack is much better in the case of this ternary layer than in the case of the ErAs layers, which are completely oxidized at the end of a few weeks.

FIG. 2 shows the results of X-ray diffraction of various epitaxial layers which were grown on GaAs in accordance with the present invention with, for comparison, erbium arsenide which was grown on gallium arsenide.

Curve (a) shows erbium arsenide deposited or grown epitaxially on gallium arsenide (001). Curve (b) shows an erbium mixed pnictide with P=0.42 and As=0.58, the whole deposited or grown epitaxially on a layer of gallium arsenide (001). Curve c also corresponds to an erbium mixed pnictide on a layer of gallium arsenide (001) with P=0.57 and As=0.43. The ratio of phosphorus to arsenic is 6 to 4. Curve d is also of the same growth type but with P=0.8 and As=0.2. Finally, curve e corresponds to a pure erbium phosphide deposited or grown epitaxially on a GaAs layer (001). The presence of oscillations due to the thin layers which enables the thicknesses to be determined, and the good agreement between the foreseeable values and the experimental values of the widths and mid-height of the peak, show the excellent crystal quality of the epitaxial layers.

Figure 3A:
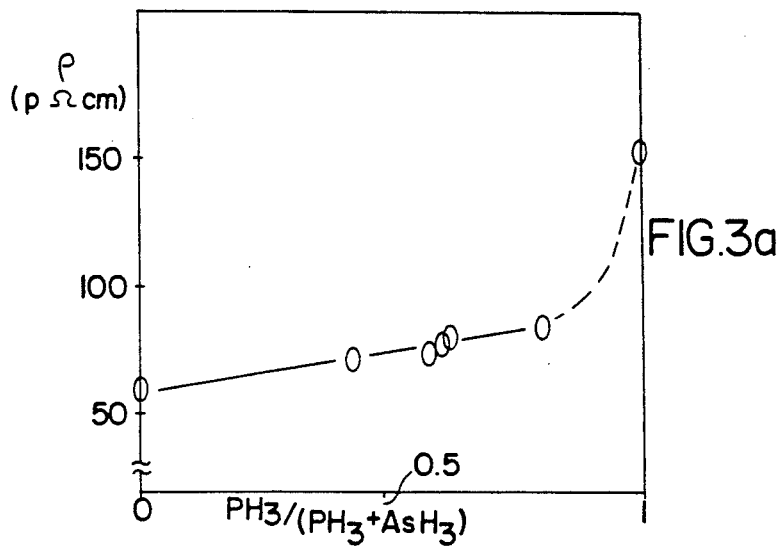
FIG. 3 shows certain mesh and resistivity parameters for ErAs, ErP and $ErP_yAs_{1-y}$ layers deposited or grown epitaxially on GaAs (001) and on InP (001), as a function of the $PH_3PH_3+AsH_3$ ratio of the fluxes during growth.
Figure 3B:
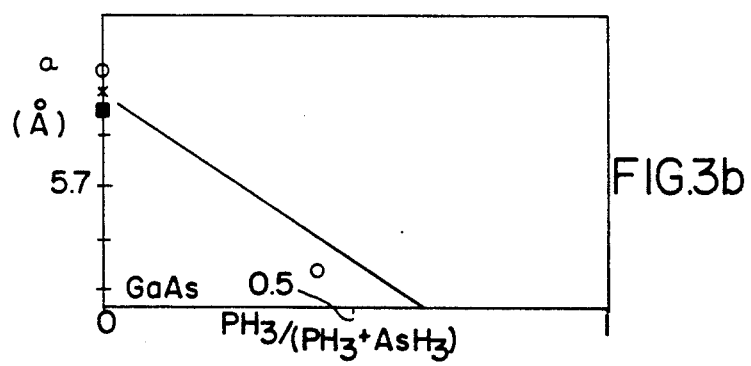
Figure 3C:
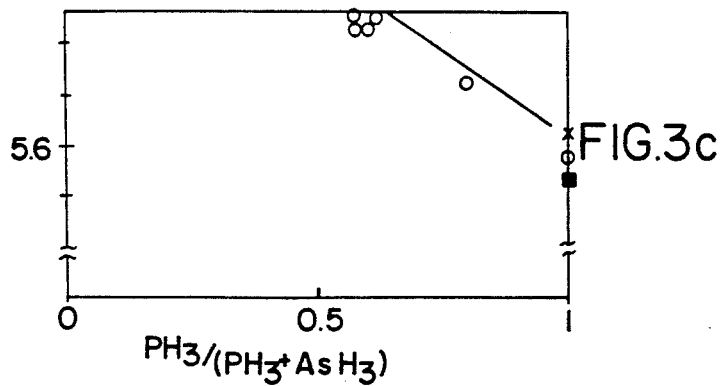
Figure 2A:
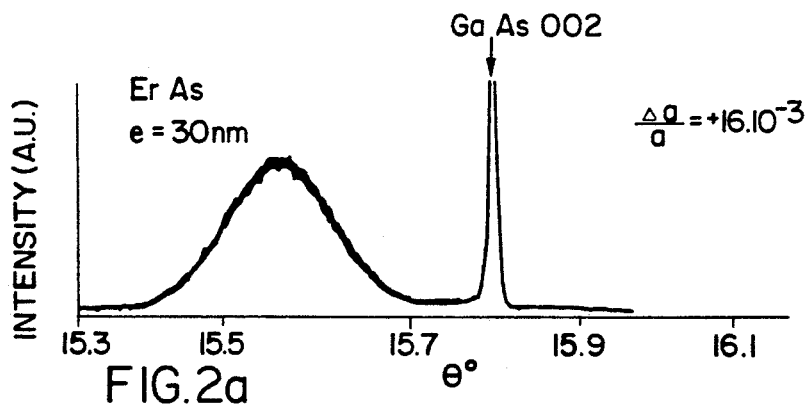
FIG. 2 shows the results of x-ray defraction of various epitaxial layers grown on GaAs in accordance with the present invention.
Figure 2B:
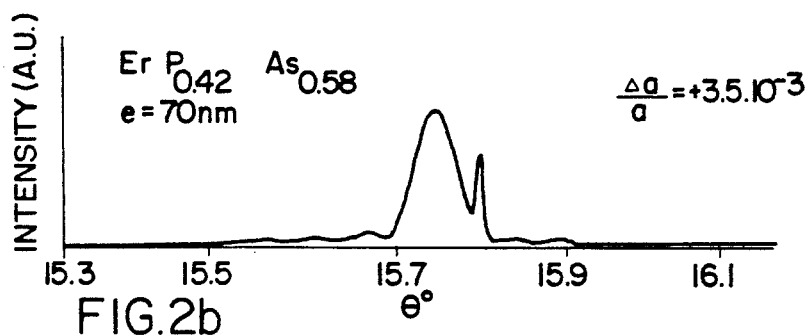
Figure 2C:
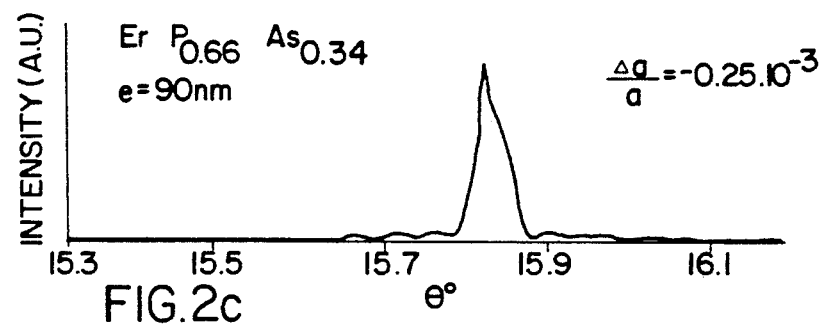
Figure 2D:
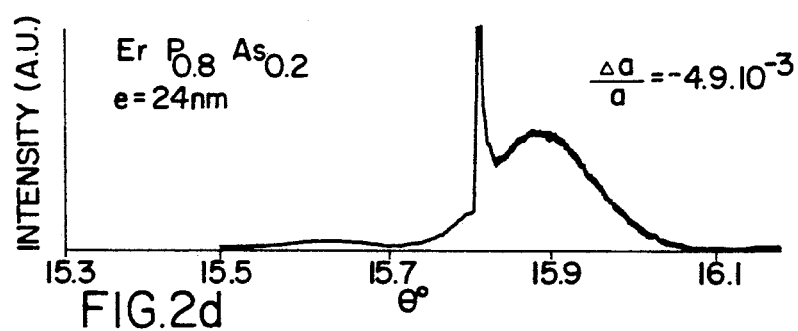
Figure 2E:
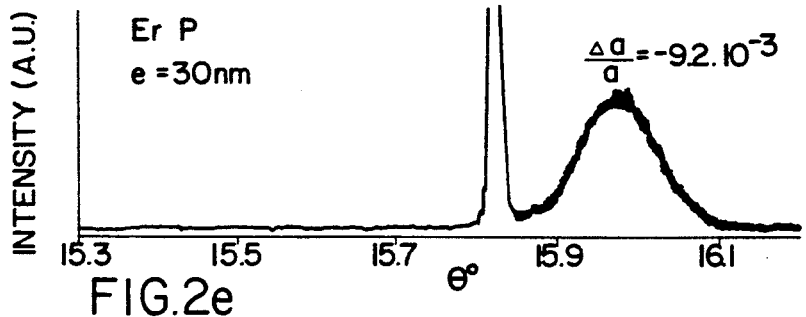

FIG. 3 shows certain mesh and resistivity parameters for ErAs, ErP and ErP$_y$As$_{1-y}$ layers deposited or grown epitaxially on GaAs (001) and on InP (001), as a function of the PH$_3$/PH$_3$+AsH$_3$ ratio of the fluxes during growth.

The points indicated by x correspond to the solid bodies or polycrystalline layers. The points marked by O correspond to a growth on gallium arsenide with plane (001) as interface plane. These values correspond to the same values as those indicated and recorded in FIG. 2. The points marked by solid squares represent the growth values on InP.

It is appropriate to point out that whereas the crystal parameters are substantially on the line which joins erbium phosphide and erbium arsenide, the resistivity values, on the other hand, are not on such a line: the resistivity is, surprisingly, substantially lower and reinforces the value of ternary compounds for producing epitaxial layers having a metallic character.

EXAMPLE 3

Repeat of epitaxy on a ternary or binary layer when the mesh agreement is adequate Thus, a structure corresponding to the following layer sequence was successfully obtained: a GaAs (111) layer on which a 5000 Å (500 nanometers) layer of GaAs was deposited or grown epitaxially. On this 5000 Å (500 nanometers layer) an epitaxy of a ternary compound ErP$_y$As$_{1-y}$ of a thickness of 27 nanometers having a mesh discrepancy Δa/a of less than $5 \times 10^{-4}$, followed by a 2100 Å (210 nanometers) re-epitaxy of gallium arsenide.

FIG. 4 shows the X-ray diagram obtained with this stack, in which the oscillations observed indicate that the layer of ternary compound produced by epitaxy and the layer of gallium arsenide produced by re-epitaxy are of very good crystal quality. In this figure, that which is indicated by α corresponds to the oscillations due to the layer of rare earth pnictides: that which is indicated by β corresponds to the layer of rare earth pnictides themselves of 27 nanometers thickness. That which is indicated by γ corresponds to the oscillations due to the surface layer of GaAs (111) of 210 nanometers thickness.

Figure 5:
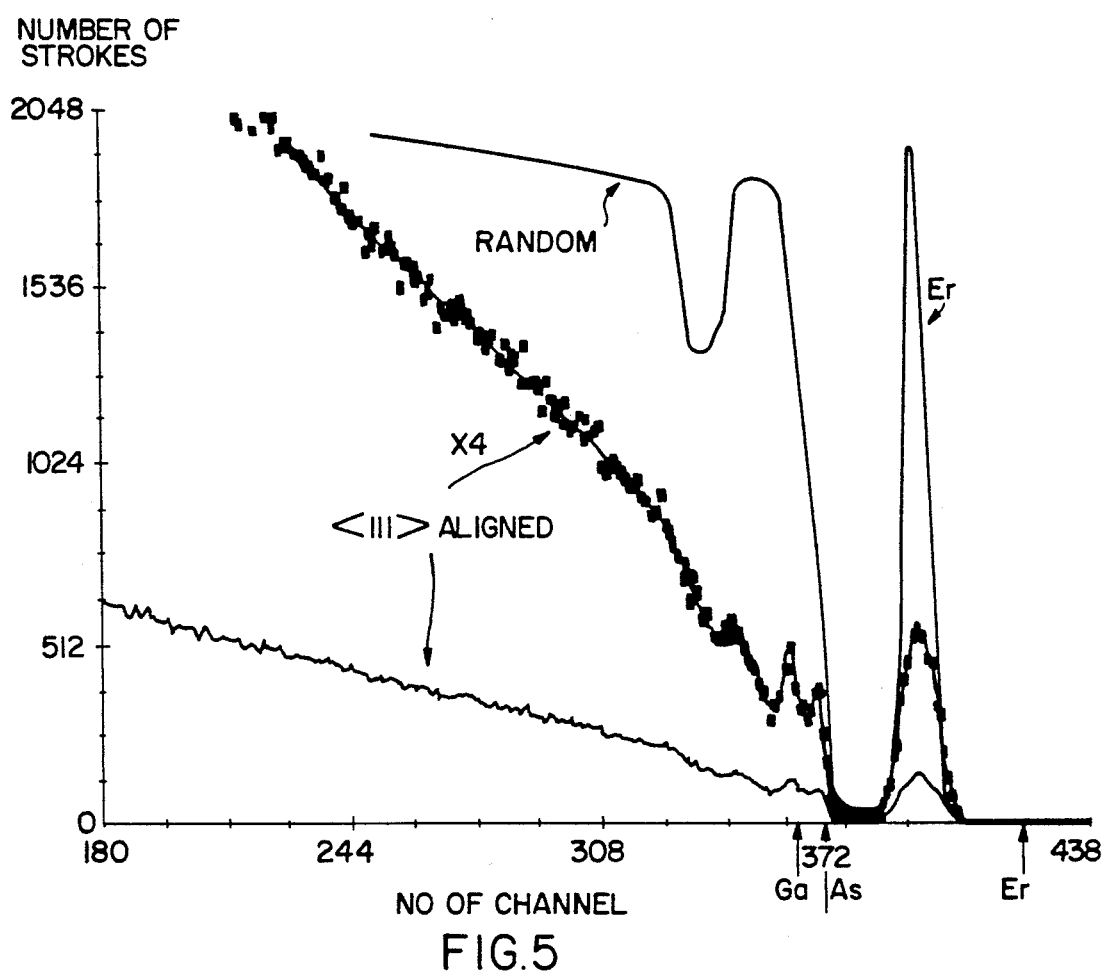
FIG. 5 shows the retrodiffusion spectrum of helium ions charged once in accordance with Example 3.

FIG. 5 indicates a retrodiffusion spectrum of helium ions charged once. The low retrodiffusion yield on re-epitaxy when the beam is aligned along the axis $<vlllv>$ (khi $_{min}=4\%$, that is to say close to the value obtained for a solid monocrystal) also signifies good quality epitaxy. Thus, layers of this type and the conditions for forming these layers would appear to be ideal for the production of super-network III-V semiconductors/metallic compounds.

We claim:

1. A composite material comprising at least one substrate layer A of III-V compound and one epitaxial layer B, having a metallic conductive character and a resistivity of at most 0.2 mill-Ohm/cm, on said layer of III-V compounds, wherein said epitaxial layer corresponds to the empirical formula REPc, where RE is selected from the group consisting of scandium yttrium, a lanthamide rare earth and mixtures thereof; and where Pc is selected from the group consisting of phosphorus, arsenic, antimony and mixtures thereof, and wherein, when Pc contains arsenic, the compound REPc is at least a ternary compound.

2. The composite material as claimed in either of claims 1, wherein RE and Pc are chosen such that the crystallographic parameters of the two layers are the same at the interface of the layer B and the layer A.

3. The composite material as claimed in claim 1, wherein the structure of compound REPc is the structure of sodium chloride.

4. The composite material as claimed in claim 1, wherein the element RE is a single rare earth.

5. The composite material as claimed in claim 1, wherein the element Pc is a single element from column 5 of the periodic table of the elements.

6. The composite material as claimed in claim 1, wherein the epitaxial layer B is at least partially covered by a new layer C.

7. The composite material as claimed in claim 6, wherein said layer C consists of a III-V compound of the same parameter as that of layer A.

8. An electronic component which contains a material as claimed in claim 1.

9. A composite material comprising at least one substrate layer A of III-V compound and one epitaxial layer B, having a metallic conductive character on said layer of III-V compounds and a resistivity of at most 0.2 mill-Ohm/cm, wherein said epitaxial layer corresponds to the empirical formula REPc, where RE is selected from the group consisting of scandium, yttrium, a lanthamide rare earth element and mixtures thereof; and where Pc is chosen from phosphorus or mixtures made of phosphorus with arsenic or with antimony, and wherein, when Pc contains arsenic, the compound REPc is at least a ternary compound.

10. The composite material of claim 9 wherein Pc is PAs.

11. The composite material of claim 9 wherein Pc is PSb.

12. The composite material according to one of claims 10 or 11 wherein REPc is such that the variation in the lattice parameters ($\Delta a/a$) is less than 1%.

* * * * *

UNITED STATES PATENT AND TRADEMARK OFFICE
CERTIFICATE OF CORRECTION

PATENT NO. : 5,213,906
DATED : May 25, 1993
INVENTOR(S) : Le Corre et al.

It is certified that error appears in the above-indentified patent and that said Letters Patent is hereby corrected as shown below:

TITLE PAGE:

[73] Assignee    after "Etat Francais"    insert --représenté par le Ministre des Postes, Télécommunications et de l'Espace (Centre National d'Etudes des Télécommunications)

Signed and Sealed this

Fourteenth Day of May, 1996

Attest:

BRUCE LEHMAN

*Attesting Officer*    *Commissioner of Patents and Trademarks*